United States Patent [19]

Criss et al.

[11] 4,361,751

[45] Nov. 30, 1982

[54] ELECTROCONDUCTIVE WINDOW HAVING IMPROVED BUS BAR

[75] Inventors: Russell C. Criss, Pittsburgh; Edward J. Stofka, Sarver, both of Pa.

[73] Assignee: PPG Industries, Inc., Pittsburgh, Pa.

[21] Appl. No.: 321,282

[22] Filed: Nov. 13, 1981

Related U.S. Application Data

[62] Division of Ser. No. 171,780, Jul. 24, 1980, Pat. No. 4,323,726.

[51] Int. Cl.$^3$ .............................................. H05B 3/06
[52] U.S. Cl. .................................. 219/522; 174/68.5; 219/203; 219/541; 219/543; 338/309
[58] Field of Search ............... 219/202, 203, 385, 386, 219/464, 522, 541, 543, 549; 174/68.5; 338/307, 308, 309, 322, 323; 29/620; 156/99; 361/397; 339/17 R, 17 F, 17 T

[56] References Cited

U.S. PATENT DOCUMENTS

| | | | |
|---|---|---|---|
| 3,288,983 | 11/1966 | Lear, Sr. ............................. | 219/522 |
| 3,299,253 | 1/1967 | Lawson, Jr. ......................... | 219/385 |
| 3,612,745 | 10/1971 | Warren ............................... | 174/68.5 |
| 3,752,348 | 9/1973 | Dickason et al. .................. | 219/203 |
| 3,772,075 | 11/1973 | Tarnopol et al. ................... | 427/98 |
| 4,035,576 | 7/1977 | Henry ................................. | 174/68.5 |
| 4,057,671 | 11/1977 | Shoop ................................. | 428/208 |
| 4,102,722 | 7/1978 | Shoop ................................. | 156/99 |
| 4,127,763 | 11/1978 | Roselli ................................ | 219/203 |
| 4,135,078 | 1/1979 | Kuiff et al. ......................... | 219/203 |
| 4,137,447 | 1/1979 | Boaz .................................... | 219/203 |
| 4,246,467 | 1/1981 | Boaz .................................... | 219/522 |

FOREIGN PATENT DOCUMENTS 844570 6/1970 Canada .................................. 154/46

*Primary Examiner*—Volodymyr Y. Mayewsky
*Attorney, Agent, or Firm*—Donald Carl Lepiane; Lee Patch

[57] ABSTRACT

An electroconductive laminated window having an electroconductive coating applied to one interior substrate surface with a pair of bus bars electrically connecting a source of electrical potential thereto. The bus bars include an electroconductive layer having volume resistivity less than about $10^{-2}$ ohm-cm interposed between and conformable to the surface configurations of the electroconductive coating and a flexible metallic current carrying member. The metallic current carrying member is preferably a mesh of thin copper foil which is substantially bendable in its own plane, and the electroconductive layer is preferably a metallic layer substantially free of non-metallic components, consisting of a mixture of finely divided electroconductive particles and finely divided metal alloy particles having a fusion temperature between about 70° C. and about 150° C.

8 Claims, 3 Drawing Figures

ELECTROCONDUCTIVE WINDOW HAVING IMPROVED BUS BAR

This is a division of application Ser. No. 171,780, filed July 24, 1980 now U.S. Pat. No. 4,323,726.

FIELD OF THE INVENTION

The present invention relates to electrical bus bars and more particularly to flexible bus bars usable in the construction of transparent electroconductive windows and methods of making same.

DISCUSSION OF THE TECHNICAL PROBLEM

It is known to apply an electroconductive coating to a nonelectroconductive substrate and pass electrical current therethrough to control the substrate temperature. This technique is commonly employed in automotive backlights, aircraft windshields, and vision panels of architectural systems. Generally, a source of electrical potential is connected to the electroconductive coating by a pair of bus bars spaced along opposite edges of the coating to uniformly distribute the electrical energy therethrough. Electroconductive coatings on the substrate are generally thin and sensitive to high current densities, which commonly cause localized destruction of coating conductivity called burnouts. As local areas of a coating burn out, the current density in other areas is correspondingly increased, thus leading to more burnouts and eventual coating failure. Further, variations in curent density in the coating yield uncontrolled temperature variations on the substrate, a generally undesirable condition. Thus, it is generally important to uniformly distribute current to the coating at a level below that at which burnouts occur.

To protect the thin and fragile electroconductive coatings, it has been the custom to laminate the substrate to additional sheets of transparent material, positioning the coated substrate surface and bus bars between the laminate layers. Bus bars are therefore required to be thin so as not to produce stress points which may interfere with successful lamination, and also flexible to adapt to the configuration of numerous laminate assembly shapes.

U.S. Pat. Nos. 4,127,763 to Roselli, 4,135,078 to Kuiff et al, and 4,137,447 to Boaz are exemplary of teachings in the art relating to the formation of bus bars by applying and firing a conductive metal-containing ceramic frit to the substrate. This technique is limited because of the generally high resistivity bus bar which results and is further limited in application by the high temperatures required during firing, making it usable only with high deformation temperature substrates.

U.S. Pat. No. 3,772,075 to Tarnopol teaches a method by which electroconductive heating circuits are applied to glass, including the steps of firing a rough ceramic frit onto the glass in the desired pattern, sensitizing the frit by chemical means, and depositing conductive metal onto the frit by electroless plating. This technique is limited by the high temperatures required for the firing step, making it usable only with high deformation temperature substrates.

U.S. Pat. Nos. 3,612,745 to Warren teaches a flexural bus bar assembly including solid strips of an electrically conductive metal foil which is laterally corrugated to about three times its original thickness to provide flexibility and responsiveness to thermal expansions and contractions. The strips of foil are embedded within an interlayer film and generally covered by an electrically conductive metallo-thermoplastic tape. The interlayer film is subsequently laminated between two transparent sheets to form a transparent window, the sheet in contact with the metallo-thermoplastic tape having an electroconductive coating applied thereon to provide heating capabilities. Electrical current is passed from an electrical source into the foil strips and therethrough into the metallo-thermoplastic tape to the electroconductive coating. Although usable with low-temperature materials such as plastics, the Warren technique is limited by the characteristics of the metallo-thermoplastic tape, which has a volume resistivity of about $1.8 \times 10^{14}$ to $2.7 \times 10^{14}$ ohm-centimeter, a value considerably higher than desirable for high current throughput. Still further, production of the tape requires a complex and time-consuming procedure, and application onto the foil strips may require manual labor which is slow and tedious.

U.S. Pat. Nos. 4,057,671 and 4,102,722 to Shoop teach a substantially all metallic low temperature fusible bus bar paste consisting of a mixture of finely divided highly electroconductive metal particles and finely divided low temperature fusible metallic alloy particles which are fused in contact with an electroconductive circuit carried on a nonelectroconductive substrate. This technique is usable with low temperature substrates and avoids many of the limitations of the prior art but is limited because the paste is the only current carrying element of the bus bar, and elongated strips of paste have an undesirably high resistance in their lengthwise direction which limits uniform current distribution to the coating. It would be desirable to have a bus bar assembly which is usable with a wide variety of substrates and coatings and which avoids the limitations of the prior art.

SUMMARY OF THE INVENTION

The present invention relates to a bus bar assembly for electrically connecting a source of electrical potential to an electroconductive pattern on a nonelectroconductive substrate at a plurality of points. The bus bar includes an elongated metallic current carrying member, e.g., a strip of metallic foil, positioned adjacent a portion of the electroconductive pattern with an electroconductive layer having a volume resistivity less than about $10^{-2}$ ohm-cm therebetween. The electroconductive layer maintains the current carrying member in spaced relation to the pattern and conforms to the surface comfigurations of both.

The electroconductive layer is preferably a metallic layer substantially free of non-metallic components, and may be a fusible material having a fusion temperature below the deformation temperature of the substrate and the decomposition temperature of the electroconductive pattern, e.g., a mixture of finely divided metallic electroconductive particles and finely divided metal alloy particles.

The elongated metallic current carrying member is preferably a flexible strip which is capable of bending in the plane containing its major surface about an inside radius less than about one half inch (1.3 cm). In a preferred embodiment, the strip is a mesh selected from the group consisting of copper, silver, gold, aluminum, or platinum, and is formed of 3 to 8 mil (0.08 to 0.2 mm) thick foil having strands 7 to 10 mils (0.18 to 0.25 mm) wide in a 2/0 to 4/0 gauge mesh.

The present invention further relates to transparent electroconductive windows consisting of a non-electroconductive transparent substrate having an electroconductive pattern thereon with the bus bar assembly of the present invention attached thereto. The substrate is laminated to a thermoplastic interlayer and second substrate with the pattern and bus bar assembly sandwiched therebetween.

The invention further relates to a method of making a bus bar assembly whereby spaced elongated layers of a fusible material are applied to an electroconductive pattern on a nonelectroconductive substrate. An elongated strip of a metallic current carrying member is positioned over the layers and heat is applied sufficient to fuse the layers to provide a volume resistivity therein of less than about $10^{-2}$ ohm-cm without detrimentally affecting the substrate or pattern. The layers may be applied by suspending finely divided particles of the fusible material in a volatile carrier material and silk-screening the suspension onto the pattern.

The present invention avoids the technical problems previously discussed by providing a thin, flexible two component bus bar assembly which demonstrates a relatively low electrical resistance and the ability to uniformly distribute current to an electroconductive pattern. The metallic current carrying member of the invention conducts current along the length of the assembly with very little loss in electrical potential, and current is conducted therefrom into the electroconductive pattern through a low resistance electroconductive layer which maintains the member and pattern in spaced relation and conforms to the surface configurations of both to avoid localized contact areas and resulting localized high current densities in the pattern. In a preferred embodiment of the invention, the electroconductive layer is a fusible material having a fusion temperature below the deformation temperature of low temperature substrates such as plastics.

DESCRIPTION OF THE INVENTION

Figure 1:
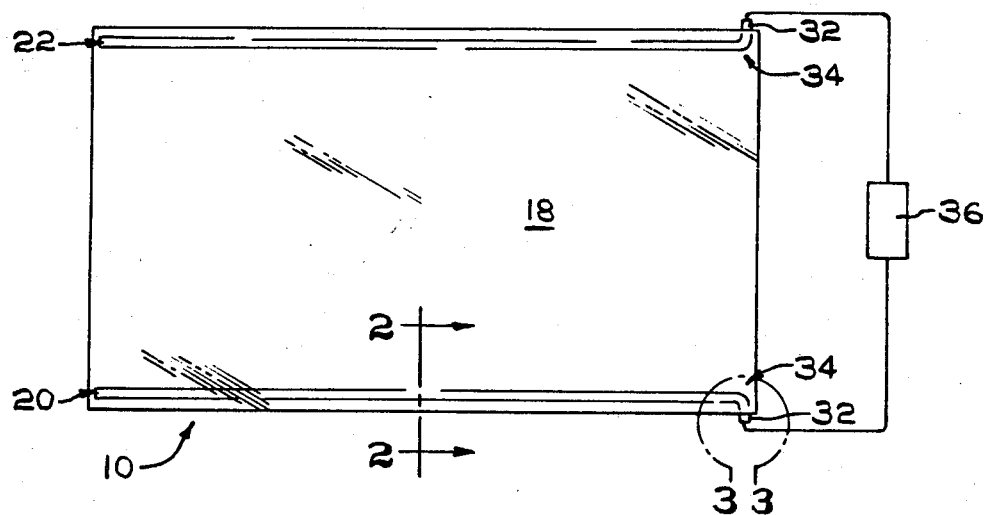
FIG. 1 is a plan view of a transparent electroconductive window incorporating features of the present invention.
Figure 2:
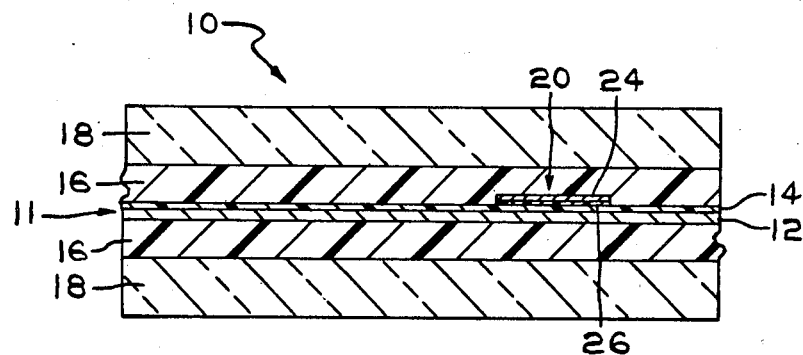
FIG. 2 is a view taken along line 2—2 of FIG. 1.

Referring to FIGS. 1 and 2, a transparent electroconductive window 10 is shown incorporating features of the present invention, including a subassembly 11, a pair of a transparent interlayers 16, and a pair of outer transparent substrates 18 conveniently laminated together to form a unitary window 10.

The subassembly 11 includes a transparent substrate 12, an electroconductive pattern 14, and bus bar assemblies 20 and 22 incorporating features of the invention. Subassembly 11 may be used by itself in the practice of the present invention, but it is preferred that it be used with interlayers 16 and substrates 18 and will be discussed accordingly.

Substrates 12 and 18 which may be used in the practice of the invention include glass and plastics such as polycarbonate, acrylic ester, polyester, and the like.

Interlayers 16 may be selected from the group of materials consisting of plasticized polyvinyl butyral, polyurethane, or similar thermoplastic materials.

The electroconductive pattern 14 is preferably a metal or metal oxide coating on the surface of substrate 12 produced by vacuum evaporation, cathode sputtering, or by the pyrolysis of a suitable metal salt. Alternatively, the pattern 14 may be a matrix of thin wires or thin strips of electroconductive material.

Figure 3:
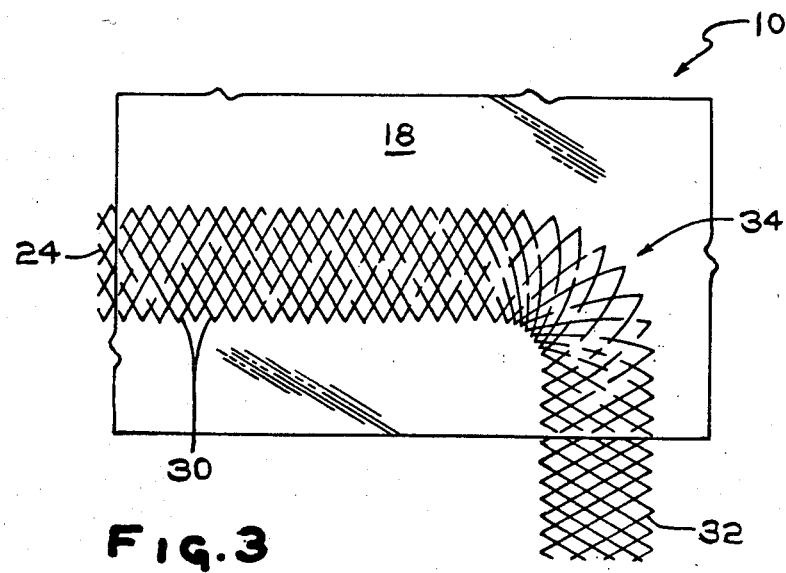
FIG. 3 is an enlarged view of the segment 3—3 of FIG. 1 illustrating features of the present invention.

Referring to FIG. 2, bus bar assemblies 20 and 22 incorporating features of the invention consist of two elements; an elongated metallic current carrying member 24 and an electroconductive layer 26. Member 24 is generally an elongated strip of a thin metal foil, e.g., copper, silver, gold, aluminum, or platinum, having very low electrical resistance, and it is preferred that the member 24 be flexible longitudinally, in a direction normal to its major surface, and in the plane of its major surface. Longitudinal flexibility permits the member 24 to be responsive to temperature-related expansions and contractions of the pattern 14 and substrate 12. Flexibility in a direction normal to its major surface permits the member 24 to readily conform to the radius of curvature of a non-planar window 10 such as might be used in automotive or aircraft applications. Flexibility in the plane of its major surface permits member 24 to change direction within window 10, as shown in FIGS. 1 and 3 at area 34, to permit convenient electrical connection therewith. Although not limiting to the invention, the member 24 may be laterally corrugated metal strips such as taught in U.S. Pat. No. 3,612,745 to Warren, which teachings are herein incorporated by reference. However, member 24 is preferably an expanded metallic mesh, as will be discussed more fully hereinafter.

The electroconductive layer 26 is positioned between the member 24 and the pattern 14 to maintain them in a spaced relation and is selected to provide a low resistance electrical connection therebetween. It is preferred that layer 26 have a volume resistivity less than about $10^{-2}$ ohm-cm and more preferably between about $10^{-4}$ ohm-cm and about $10^{-5}$ ohm-cm, a low volume resistivity being desirable to reduce bus bar heating and to conduct a greater proportion of the electrical energy into the working portion of the circuitry, i.e., pattern 14. In the practice of the invention it is also preferred that member 24 and pattern 14 remain in spaced relation to avoid localized areas of contact therebetween which would produce localized areas of high current density and resulting burnouts. Accordingly, although not limiting to the invention layer 26 is preferably formed of a metallic material substantially free of non-metallic components which is conformable to the contacted surfaces of member 24 and pattern 14 to provide a large area of electrical contact therebetween. The substantially all-metallic composition of layer 26 provides a substantially continuous conductive path between member 24 and pattern 14, with a minimum of nonconducting portions therethrough which might produce localized high current densities.

The substantially continuous conductive path provided by the substantially all metallic layer 26 is particularly beneficial when used in conjunction with the preferred mesh member 24, because the noncontinuous mesh member 24 displays a smaller electrical contact area then would a continuous strip, and therefore is more sensitive to discontinuities in the conductivity of the layer 26. When member 24 is a continuous strip, layer 26 may be formed of a material which includes non-metallic components, for example; a conductive silver composition designated as number 4929 by the duPont Company.

Although not limiting to the invention, layer 26 is preferably formed of a fusible material having a fusion temperature below the deformation temperature of substrates 12 and 18 and the decomposition temperature of pattern 14. In one embodiment of the invention, the fusible material consists of a mixture of finely divided metallic electroconductive particles and finely divided metal alloy particles having a fusion temperature in the previously mentioned range. For example, the fusible material may consist of 85 to 97 parts by weight of metallic electroconductive particles, e.g. silver, gold, platinum, copper, aluminum, and high melting point electroconductive alloys, and 15 to 3 parts by weight metal alloy particles, as taught in U.S. Pat. No. 4,057,671 to Shoop, which teachings are herein incorporated by reference. Preferably the fusible material has a fusion temperature between about 70° C. and about 150° C., for reasons to be discussed hereinafter.

Generally, the electroconductive layer 26 is positioned to contact the pattern 14 of substrate 12 at a plurality of points in any convenient manner and member 24 is positioned on the exposed surface of layer 26. Thereafter, heat is supplied sufficient to raise the temperature above the fusion temperature of layer 26 but below the deformation temperature of substrates 12 and 18 and decomposition temperature of pattern 14, thus fusing the layer 26 into conformity with the surface configurations of the member 24 and pattern 14 and providing low resistance electrical contact therebetween.

DESCRIPTION OF THE PREFERRED EMBODIMENT

Referring to FIG. 2, a transparent substrate 12 is provided of a polyethylene terephthalate material of the type sold under the trademark MYLAR by duPont, having a thickness of about 5 mils (0.13 mm). An electroconductive pattern 14 in the form of a silver titania film is coated upon a major surface of substrate 12 in a manner taught in U.S. Pat. No. 3,962,488 to Gillery, which teachings are herein incorporated by reference.

The electroconductive layer 26 is formed of a mixture of about 90 parts by weight finely divided silver particles and 10 parts by weight finely divided metal alloy particles. The metal alloy particles preferably consist of about 42 to 52 parts by weight bismuth, 31 to 39 parts by weight lead, 1 to 8.5 parts by weight cadmium, and 3 to 15 parts by weight tin, and more preferably about 50 parts by weight bismuth, 39 parts by weight lead, 7 parts by weight cadmium, and 4 parts by weight tin, having a liquidus temperature of about 94° C. (200° F.). The mixture is added to a volatile carrier material such as pine oil to achieve a viscosity suitable for silk-screening, (30 parts pine oil to 100 parts mixture) and silk-screened into position along opposite edge portions of the pattern 14 in bands about 5 mils (0.13 mm) thick having a width equal to or slightly greater than the width of the current carrying members 24.

Current carrying members 24 are placed over the exposed surfaces of layers 26, with end portions 32 extending beyond the periphery of substrate 12 to serve as electrical leads for completion of the circuit. Solder is conveniently fused to the end portions 32 to add structural stability thereto.

Referring now to FIG. 3, a preferred embodiment of the current carrying member 24 is shown, consisting of a thin, flexible expanded mesh of copper foil about 3 to 8 mils (0.08 to 0.2 mm) thick, having strands 30 of about 7 to 10 mils (0.18 to 0.25 mm) wide formed into a 2/0 to 4/0 gauge mesh. The mesh may be of the type sold by the Exmet Corporation of Bridgeport, Connecticut and is preferred over the laterally corrugated copper foil taught in U.S. Pat. No. 3,612,745 because of its superior ability to form small inside radius bends in its own plane. Referring to area 34 of FIG. 3, there is shown a small radius 90° bend in the mesh which is accomplished without appreciable increase or decrease in thickness in the area of curvature, made possible by the expansion of the mesh separations in the area adjacent the outside of the curve and the corresponding contraction of the mesh separations in the area adjacent the inside of the curve. As can be appreciated, changes in thickness at the area of curvature are preferably avoided in order to minimize electrical resistance variations in the member 24, and also to avoid stress points which can detrimentally affect subsequent lamination procedures. The previously mentioned laterally corrugated copper foil must be folded in the corners to form bends of inside radius less than one-half inch (1.2 cm), whereas the preferred mesh may be curved to an inside radius of less than one eighth inch (0.3 cm).

Referring now to FIGS. 1 and 2, after the member 24 is in position, the pine oil carrier is conveniently evaporated from the layer 26 and interlayers 16 of polyvinyl butyral and outer substrates 18 of glass are positioned about the subassembly 11. The assembly is then laminated with heat and pressure to bond the interlayers 16 to the substrates 18 and 12. It is during the lamination process that the layer 26 is heated above its liquidus temperature and subsequently cooled to fuse it in position between the pattern 14 and member 24 to provide a low resistance electrical connection therebetween. During the lamination process the layer 26 is maintained above its liquidus temperature under pressure for about thirty minutes, during which time it is preferred that the layer 26 remain in its predetermined position and not freely flow onto the vision areas of the substrate 12. To prevent this occurrence, a fusible material is selected having a liquidus temperature only slightly below the laminating temperature. Further, the preferred mesh member 24 helps to resist flow during this period by trapping portions of the liquified layer 26 within separations in the mesh to retain it in its predetermined position.

In operation, the end portions 32 of bus bars 20 and 22 may be connected to a source of alternating electrical potential 36, or alternatively, a D.C. power source may be utilized, and it is preferred in either case to power the system at 1 to 5 watts/sq. in. (0.15 to 0.75 watts/sq. cm). The low resistance current carrying member 24 of bus bars 20 and 22 permits electrical current to pass along the length of bus bars 20 and 22 with very little drop in electrical potential thereacross, thus providing a substantially uniform potential difference across pattern 14. Layer 26 spaces member 24 from the pattern 14 to eliminate localized areas of contact therebetween, yet provides a low resistance path for uniform current distribution. In this way very little electrical energy is wasted heating the bus bars, and a greater proportion passes into the pattern 14 to heat the desired areas of the window 10.

While the invention disclosed herein represents an illustrative preferred embodiment, it is understood that various changes may be made without departing from the gist of the invention defined in the claims which follow.

We claim:

1. A transparent electroconductive window comprising:
   a non-electroconductive transparent substrate;
   an electroconductive pattern on said substrate;
   at least one elongated metallic current carrying member positioned adjacent said pattern at a plurality of points; and
   an electroconductive layer between and in contact with adjacent surfaces of said current carrying member and said electroconductive pattern to maintain same in spaced relation, said layer conforming to the surface configurations of both the contacted adjacent surfaces of said member and said pattern to minimize localized high current densities therebetween and having a volume resistivity less than about $10^{-2}$ ohm-cm., wherein said layer comprises a mixture of finely divided metallic electroconductive particles bound together by fused metal alloy particles substantially free of non-metallic components.

2. The window as set forth in claim 1 wherein the non-electroconductive substrate is a first substrate and further comprising:
   a transparent interlayer; and
   a second transparent substrate, said interlayer and second substrate laminated to said first substrate to sandwich said pattern, said layer, and said member therebetween.

3. The window as set forth in claim 1 or claim 2 wherein said layer is formed of a fusible material comprising a mixture of:
   finely divided metallic electroconductive particles; and
   finely divided metal alloy particles having a fusion temperature between about 70° C. and about 150° C.

4. The window as set forth in claim 3 wherein said mixture comprises:
   85 to 97 percent of said metallic electroconductive particles; and
   15 to 3 percent of said metal alloy particles.

5. The window as set forth in claim 4 wherein said metallic electroconductive particles are silver and said metal alloy particles comprise by weight:
   42 to 52 parts bismuth;
   31 to 39 parts lead;
   1 to 8.5 parts cadmium; and
   3 to 15 parts tin.

6. The window as set forth in claim 1 or 2 wherein said current carrying member comprises:
   a flexible strip capable of bending in the plane containing its major surface about an inside radius of less than one half inch (1.3 cm).

7. The window as set forth in claim 6 wherein said flexible strip comprises a mesh.

8. The window as set forth in claim 2 wherein said first and second substrate is selected from the group consisting of glass, polycarbonates, acrylic esters, polyesters, polyvinyl acetals, polyurethanes.

* * * * *